(12) United States Patent
Schuelein

(10) Patent No.: US 6,995,435 B2
(45) Date of Patent: Feb. 7, 2006

(54) APPARATUS AND CIRCUIT HAVING REDUCED LEAKAGE CURRENT AND METHOD THEREFOR

(75) Inventor: Mark E. Schuelein, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/925,699

(22) Filed: Aug. 24, 2004

(65) Prior Publication Data

US 2005/0017308 A1    Jan. 27, 2005

Related U.S. Application Data

(63) Continuation of application No. 10/255,524, filed on Sep. 25, 2002, now Pat. No. 6,800,908.

(51) Int. Cl.
*H01L 29/76* (2006.01)

(52) U.S. Cl. .............. 257/369; 257/370; 257/371; 257/372; 257/373; 438/198; 438/199; 438/200

(58) Field of Classification Search ............ 257/365, 257/366, 367, 369, 370, 529, 530, 371, 372; 320/33, 34; 327/503, 544; 438/195, 199, 438/20

See application file for complete search history.

(56) References Cited

U.S. PATENT DOCUMENTS

| 6,864,708 B2 * | 3/2005 | Takahashi et al. ............ 326/33 |
| 2004/0065941 A1 * | 4/2004 | Marr ........................... 257/530 |

* cited by examiner

*Primary Examiner*—Nathan J. Flynn
*Assistant Examiner*—Fazli Erdem
(74) *Attorney, Agent, or Firm*—Stuart A. Whittington

(57) ABSTRACT

Briefly, in accordance with one embodiment of the invention, an integrated circuit has a voltage generator that selectively increases the voltage potential on the channel region of a transistor relative to the source region of the transistor. The voltage potential may be provided to a diffusion region in the well regions with transistors.

16 Claims, 3 Drawing Sheets

APPARATUS AND CIRCUIT HAVING REDUCED LEAKAGE CURRENT AND METHOD THEREFOR

CROSS-REFERENCE TO RELATED APPLICATIONS

This application claims benefit of priority under 35 U.S.C. §120 and is a continuation to U.S. application Ser. No. 10/255,524 filed on Sep. 25, 2002 by the same inventors, now U.S. Pat. No. 6,800,908.

BACKGROUND

Advances in manufacturing techniques have allowed transistors to be made with smaller geometries. For example, photolithographic and etch techniques have improved to the point where transistors with a gate length of less than 0.10 microns ($\mu$m) may be made. Decreasing the size of transistors is generally perceived to be beneficial because this may allow more transistors to be made within the same amount of area on a semiconductor die.

However, as the gate length of a transistor is reduced, the distance between the current carrying electrodes (e.g., source and drain terminals) may also be proportionately reduced. Consequently, the amount of semiconductor material between these terminals and beneath the gate of the transistor, often referred to as a channel or body region, may be reduced. As the length of the channel region of a transistor is reduced, the electric field of the drain terminal may have a greater effect upon the flow of current in the channel region. Thus, reductions in channel length may make it more difficult to control the flow of current across the channel region between the source and drain terminals and lead to an increase in the amount of source-to-drain leakage (e.g., off-state current).

Techniques to address this leakage current may involve applying a voltage potential to the bulk or channel region when the transistors are inactive. However, such techniques often involve the use of additional metal lines that are routed across an integrated circuit to provide the leakage reducing voltage potential. This, in turn, may increase the complexity and cost of the manufacturing process. Thus, there is a continuing need to reduce the leakage current between the current carrying electrodes of transistors.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
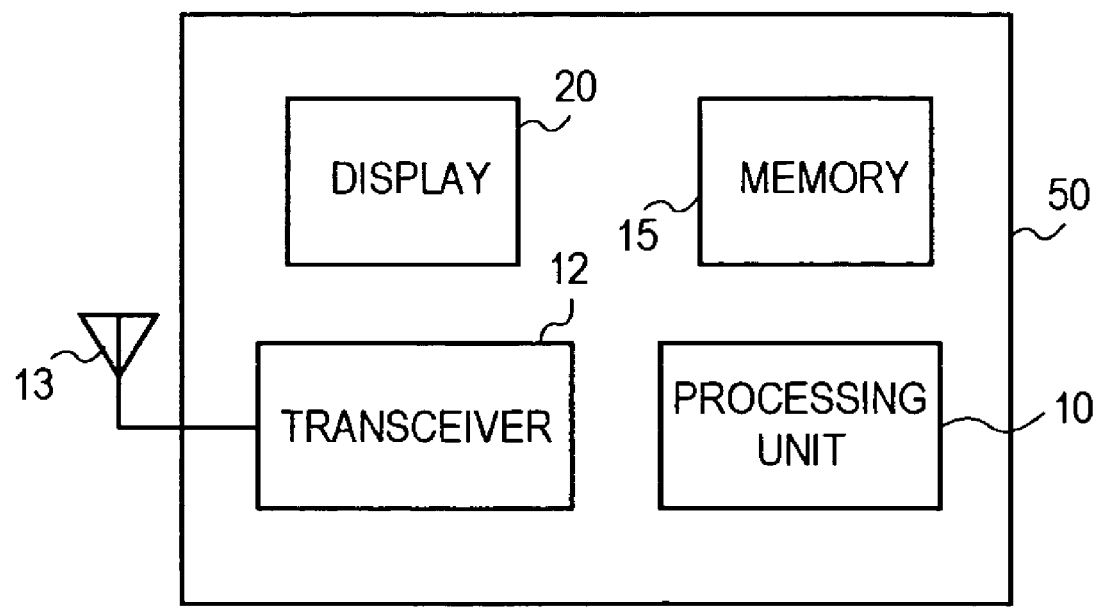
FIG. 1 is a block diagram of a computing system in accordance with an embodiment of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention. Note, in this description a "#" symbol is used to indicate the logical complement of a signal. For example, if BL is a logic "1," then BL# is a logic "0," although this invention is not limited to any particular signaling scheme.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

It should be understood that embodiments of the present invention may be used in a variety of applications. Although the present invention is not limited in this respect, the circuits disclosed herein may be used in many apparatuses such as in the transmitters and receivers of a radio system. Radio systems intended to be included within the scope of the present invention include, by way of example only, cellular radiotelephone communication systems, satellite communication systems, two-way radio communication systems, one-way pagers, two-way pagers, personal communication systems (PCS), personal digital assistants (PDA's) and the like.

Types of cellular radiotelephone communication systems intended to be within the scope of the present invention include, although not limited to, Code Division Multiple Access (CDMA) cellular radiotelephone communication systems, Global System for Mobile Communications (GSM) cellular radiotelephone systems, North American Digital Cellular (NADC) cellular radiotelephone systems, Time Division Multiple Access (TDMA) systems, Extended-TDMA (E-TDMA) cellular radiotelephone systems, third generation (3G) systems like Wide-band CDMA (WCDMA), CDMA-2000, and the like.

Turning to FIG. 1, an embodiment 100 in accordance with the present invention is described. Embodiment 100 may comprise a computing system 50 such as, for example, a portable device such as a mobile communication device (e.g., cell phone), a two-way radio communication system, a one-way pager, a two-way pager, a personal communication system (PCS), a portable computer, or the like. Although it should be understood that the scope and application of the present invention is in no way limited to these examples.

Computing system 50 here includes a display 20 to provide information to a user, a memory 15, and a processing unit 10 that may comprise one or more integrated circuits, although the scope of the present invention is not limited in this respect. Processing unit 10 may comprise, for example, a microprocessor, a digital signal processor, a microcontroller, or the like. Simply stated, processing unit may be used to execute instructions to provide information or communications to a user. Instructions to be executed by processing unit may be stored in memory 15, although the scope of the present invention is not limited in this respect.

Memory 15 may comprise, for example, disk including floppy disks, optical disks, CD-ROMs, magnetic-optical disks, read-only memories (ROMs), random access memories (RAMs) such as dynamic RAM (DRAM) or static RAM (SRAM), electrically programmable read-only memories (EPROMs), electrically erasable and programmable read only memories (EEPROMs), a flash memory array, magnetic or optical cards, or any other type of media suitable for storing electronic instructions.

Computing device 50 may also include a transceiver 12 and an antenna 13 to provide wireless communication with other devices. Although the scope of the present invention is not limited in this respect, transceiver 12 may permit computing device 50 to communicate using one of the communication standards listed above. Alternatively, computing device 50 may include hardware to permit computing device 50 to communicate with or as part of a wireless local area network (WLAN).

Figure 2:
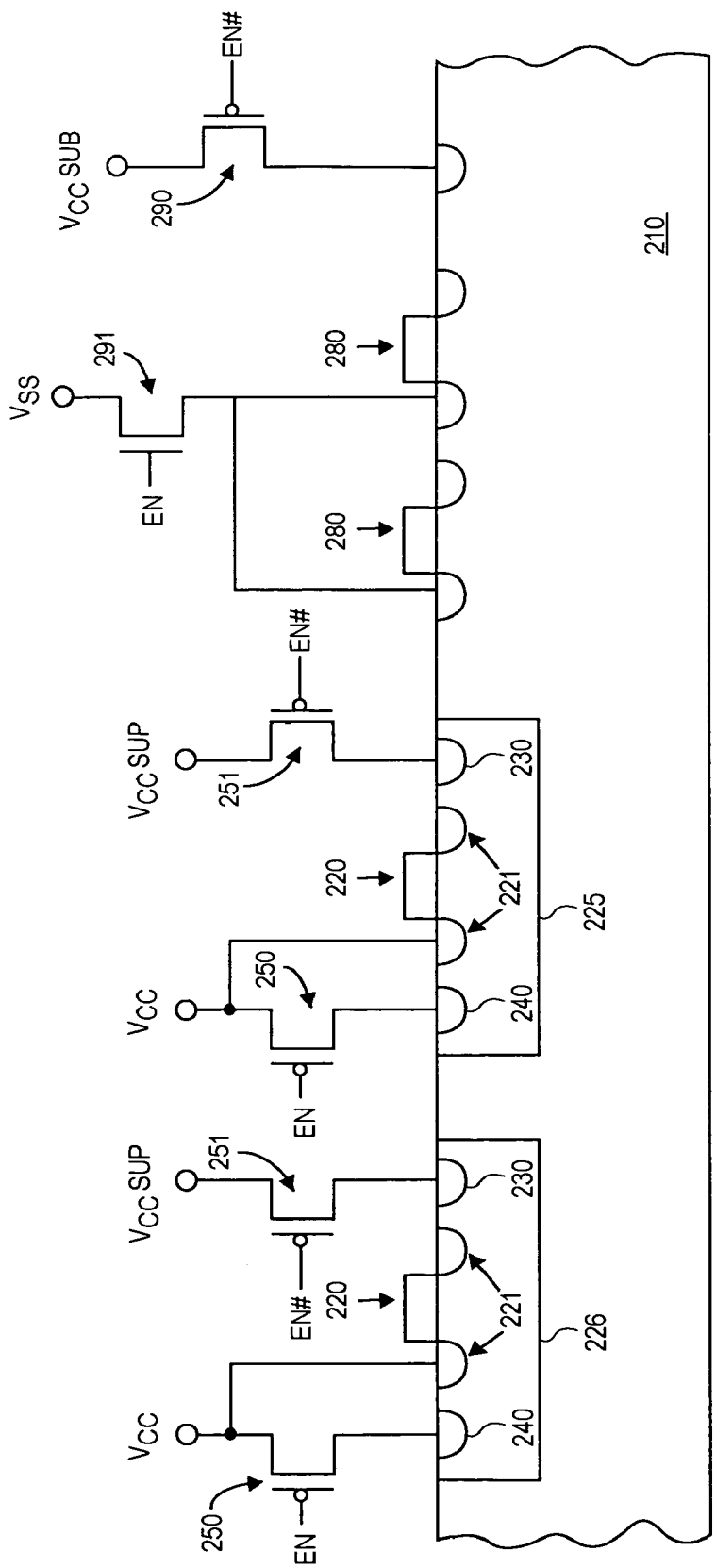
FIG. 2 is a cross-sectional representation of transistors in accordance with an embodiment of the present invention.

Turning to FIG. 2, a portion of an integrated circuit 200 that may be used to provide a portion of processing unit 10 (see FIG. 1) is described. FIG. 2 is a combination of a cross section of a portion of a semiconductor substrate 210 in which portions of transistors 220 and 280 may be formed. In addition, portions of a circuit schematic have been added to illustrate how power supply voltage potentials may be applied to various portions of semiconductor substrate 210 to reduce the leakage currents within semiconductor substrate 210.

Although the scope of the present invention is not limited in this respect, semiconductor substrate 210 may be doped p-type in which well regions 225 and 226 may be formed with an n-type dopant. Well regions 225 and 226 may contain portions of p-channel metal oxide semiconductor (PMOS) transistors 220 (i.e. well regions 225–226 may contain current carrying electrodes 221, such as source and drain regions, along with the corresponding channel region between the current carrying electrodes). Transistors 220 may be connected as desired to provide the logic operations or other circuitry of processing unit 10. Further, it should be understood that FIG. 2 may only illustrate a small portion of processing unit 10 and that semiconductor substrate 210 may comprise additional well regions and PMOS transistors. Alternatively, the conductivity type of substrate 210 and/or well regions 225–226 may be altered as desired.

Well regions 225 and 226 may further include a doped or diffusion region, such as diffusion regions 241 and 240, respectively. Although the scope of the present invention is not limited in this respect, doped regions 240–241 may be doped to an n-type conductivity and may be used to bias portions of well regions when transistors 220 are inactive or in a disabled operational mode. Diffusion regions may be formed by introducing an n-type dopant into a portion of well regions 225–226. Although the scope of the present is not limited in this respect, diffusion regions 240–241 may be formed using an ion implantation process.

Integrated circuit 200 may have a variety of operational modes; some of which may be used to reduce the amount of power consumed by computing device 50. For example, although the scope of the present invention is not limited in this respect, integrated circuit 200 may have an active mode during which transistors 220 may be used and an inactive operational mode during which transistors 220 may not be needed. Although the scope of the present invention is not limited in this respect, in one particular embodiment, the active mode may represent a condition during which computing device 50 may be in use by a user whereas the inactive mode may occur if the user turns computing device 50 off or places computing device 50 in a stand-by, low power mode. When in the low power operational mode, computing device 50 may halt or slow down the execution of instructions in an attempt to reduce its power consumption. While in this operational mode, the power supply potentials may be applied to transistors 220 so that the volatile logic value is not lost or changed during this operational mode. Consequently, the data or logic value stored in transistors 220 may be used when computing device 50 again changes operational modes and begins executing instructions.

In the inactive mode, it may be desirable to apply a voltage potential to wells 225–226 that is greater than the voltage potential of the current carrying electrodes of transistors 220. In the particular embodiment shown in FIG. 2, integrated circuit 200 may include transistors 250–251 that may be used to provide power supply voltage potentials of portions of wells 225–226 and transistors 220. In the particular embodiment shown in FIG. 2, the source of transistors 250 is directly connected to diffusion regions 240. However, the scope of the present invention is not limited in this respect. In alternative embodiments, the source of transistors 250 may be shared with diffusion regions 240, or alternatively, additional circuitry may be inserted there between to couple transistors 250–251 to well regions 225–226.

As shown in the particular embodiment of FIG. 2, although the scope of the present invention is not limited in this respect, a control or enable signal, labeled EN in FIG. 2 as "EN", may be used to control or indicate when integrated circuit 200 is in a low power mode such as drowsy, stand-by, sleep, etc. Although the scope of the present invention is not limited in this respect, the enable signal, EN, may be an active high signal. However, in alternative embodiments, an active low signal may be used with the associated changes in the transistors used. Thus, the control signal EN may be used to indicate when PMOS transistors 220 are to be placed in the disabled operational mode.

For example, when transistors 220 are active or in use, a power supply voltage potential, labeled Vcc, may be applied to the a current carrying electrode (e.g. a drain terminal) of transistors 220. In addition, the control signal EN may be deasserted so as to allow transistors 250 to provide approximately the same power supply voltage potential to well regions 225–226. It should be noted in this particular embodiment, transistors 251 are not enabled (e.g. they are turned off).

When a portion of integrated circuit 200 is to enter an inactive or disabled operational mode, the control signal EN may be asserted. This in turn may enable transistor 251 so that transistor 251 may provide diffusion region 230 with another power supply voltage potential, namely Vccsub. In this particular embodiment Vccsub is greater than Vcc. For example, although the scope of the present invention is not limited in this respect, Vccsub may be approximately 0.2–0.9 volts greater than Vcc.

Thus, diffusion region 230 may be used to provide a higher voltage potential to well regions 225–226, and, in turn, a higher voltage potential to the channel region of transistors 220 than that of the drain terminal of transistors 220. This may reduce the amount of leakage current and/or power consumption of integrated circuit 200. It should be noted that when the control signal EN is asserted, transistor 250 may be deasserted thereby disconnecting diffusion region 240 from the Vcc power supply voltage potential.

In alternative embodiments of the present invention, although not necessarily all, it may be desirable to include addition diffusion regions that may be coupled to the Vcc power supply voltage potential with transistors. These addition diffusion regions may be spaced throughout well regions 225–226 as desired and the control signal EN may be used to control the application of the Vcc power supply voltage potential to well regions 225–226 as described above.

As shown in FIG. 2, integrated circuit 200 may also optionally include n-channel metal oxide semiconductor (NMOS) transistors 280 that may be used independently or in conjunction with transistors 220 to provide logic operations while computing device 50 is in operation. NMOS transistors 280 may include current carrying electrodes 281 (e.g. source and drain regions that may be formed in semiconductor substrate 210. In addition, integrated circuit 200 may include transistors 290–291 that may be used to reduce the leakage currents associated with transistors 280. For example, transistors 291, controlled by control signal EN, may be used to provide a power supply voltage potential Vsssub to semiconductor substrate 210. Since transistors 280 are NMOS transistors, it may be desirable to have Vsssub be less than the Vss power supply voltage potential that is applied to the drain terminals of transistors 280.

Thus, when the control signal EN is asserted to indicate transistors 280 are to enter a disabled operational mode, transistor 290 may provide a voltage potential to the channel region of transistors 280 so that the leakage current associated with transistors 280 may be reduced. In one particular embodiment, integrated circuit 200 may include a regulator (not shown) that may provide the Vss power supply voltage potential that is about 0.2–0.9 volts greater than the Vsssub voltage potential when integrated circuit 200 is in a disabled operational mode. In addition, the regulator may optionally adjust the Vss and Vsssub power supply voltage potentials so that they are substantially equal when integrated circuit 200 is in an active operational mode.

Figure 3:
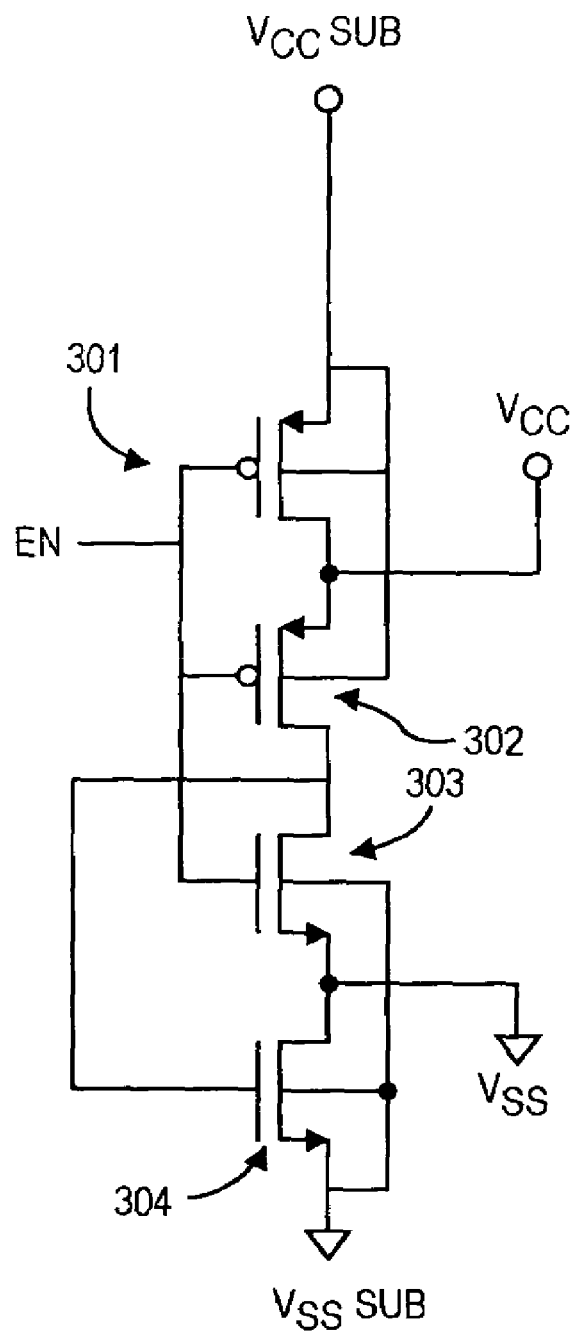
FIG. 3 is a schematic representation in accordance with an alternative embodiment of the present invention.

Turning to FIG. 3 a particular embodiment for proving some of the power supply voltage potentials is provided, although the scope of the present invention is not limited in this respect. In this particular embodiment, it may be desirable to assume that the Vcc power supply voltage potential is no more than a threshold voltage potential (Vtp) of transistor 301 from the Vccsub voltage potential (i.e. Vcc is equal to or less than Vccsub by no more than the threshold voltage of transistor 301). Similarly, it may be desirable to assume that the Vss power supply voltage potential is no more than a threshold voltage potential of transistor 304 above the Vsssub voltage potential. In this particular arrangement, the circuit shown in FIG. 3 may be self regulating, although the scope of the present invention is not limited in this respect.

As shown in FIG. 3, when the control signal EN is asserted, transistors 301–302 may be turned off and transistor 303 may be turned on. This will in turn cause the voltage on the gate of transistor 304 to go to Vss. In this state, the circuit will regulate Vcc to be roughly Vccsub–Vtp and Vss to be roughly Vss+Vtn. This biasing regulation may reduce the leakage in all transistors whose power is supplied by this circuit.

By now it should be appreciated that the present invention provides circuits and methods by which the leakage current of an integrated circuit may be reduced. In particular embodiments, although not necessarily all, each well region may have a diffusion region that may be coupled to a power supply voltage potential when transistors in the well region are to enter a low power mode. The reverse biasing of the channel or body region relative to the current carrying electrodes may increase the potential barrier created by the channel region. Consequently, this may make it more difficult for electrons to pass between the current carrying electrodes of the transistor.

While certain features of the invention have been illustrated and described herein, many modifications, substitutions, changes, and equivalents will now occur to those skilled in the art. For example, in alternative embodiments the conductivity of transistors may be changed to the opposite type. In addition, in some embodiments a diffusion region was used to provide electrical contact to well regions. In alternative embodiments other techniques may be used such as contacts, metal contacts, etc. It is, therefore, to be understood that the appended claims are intended to cover all such modifications and changes as fall within the true spirit of the invention.

What is claimed:

1. An apparatus comprising:
   a semiconductor substrate having a first well region and a second well region in which at least a portion of a p-channel metal oxide semiconductor (PMOS) transistor is formed;
   a first diffusion region in the first well region; and
   a second diffusion region in the second well region, wherein the first diffusion region is adapted to have a first voltage potential when the PMOS transistor is in an inactive operational mode; and wherein the second diffusion region is adapted to have the first voltage potential when the PMOS transistor is in the inactive operational mode, and wherein the first voltage potential is greater than a voltage potential of current carrying electrodes of the PMOS transistor.

2. The apparatus of claim 1 wherein the first and second diffusion regions are supplied the first voltage potential in response to a control signal indicating the PMOS transistor is in the inactive operational mode.

3. The apparatus of claim 1 further comprising:
   a third diffusion region in the first well region, wherein the third diffusion region is adapted to have the first voltage potential when the PMOS transistor is in the inactive operational mode.

4. The apparatus of claim 3 further comprising:
   a fourth diffusion region in the second well region, wherein the fourth diffusion region is adapted to have the first voltage potential when the PMOS transistor is in the inactive operational mode.

5. The apparatus of claim 1 further comprising:
   a third diffusion region in the first well region of the semiconductor substrate, wherein the third diffusion region is adapted to have a second voltage potential when the PMOS transistor is in an active operational mode.

6. The apparatus of claim 5 wherein the second voltage potential is less than the first voltage potential.

7. The apparatus of claim 1 further comprising one or more transistors coupled to the first and second diffusion regions to supply the first voltage potential.

8. The apparatus of claim 5 wherein the PMOS transistor includes a current carrying electrode having the second voltage potential when the PMOS transistor is in the active operational mode.

9. The apparatus of claim 1 wherein the semiconductor substrate includes another region in which at least a portion of an n-channel metal oxide semiconductor (NMOS) transistor is formed, the semiconductor substrate including a third diffusion region adapted to have a second voltage potential when the NMOS transistor is in the inactive operational mode.

10. The apparatus of claim 9 wherein the NMOS transistor includes a drain region to be coupled to a third voltage potential, wherein the second voltage potential is less than the third voltage potential when the NMOS transistor is in the inactive operational mode.

11. The apparatus of claim 10 wherein the second voltage potential is substantially equal to the third voltage potential when the NMOS transistor is in an active operational mode.

12. A system comprising:
a flash memory array; and
a processor coupled to the flash memory array, the processor comprising at least;
a semiconductor substrate having a first well region and a second well region in which at least a portion of a p-channel metal oxide semiconductor (PMOS) transistor is formed, the first and second well regions respectively including diffusion regions, wherein the diffusion regions are adapted to have a first voltage potential when the PMOS transistor is in an inactive operational mode and wherein the first voltage potential is greater than a voltage potential of current carrying electrodes of the PMOS transistor, wherein the diffusion regions comprise two diffusion regions in each of the first and second well regions.

13. The system of claim 12 further comprising one or more transistors coupled to the diffusion regions to provide the first voltage potential in response to a control signal indicating if the PMOS transistor is in the inactive operational mode.

14. The system of claim 12 further comprising a third diffusion region in the first well, wherein the third diffusion region is adapted to have a second voltage potential when the PMOS transistor is in the inactive operational mode.

15. The system of claim 14 wherein the second voltage potential is less than the first voltage potential.

16. The system of claim 12 further comprising a transceiver in communication with the processor.

* * * * *